US012694896B2

(12) United States Patent (10) Patent No.: US 12,694,896 B2
Okano et al. (45) Date of Patent: Jul. 28, 2026

(54) DISK DEVICE WITH FPC AND CHIP

(71) Applicants: Kabushiki Kaisha Toshiba, Tokyo
(JP); **Toshiba Electronic Devices &
Storage Corporation**, Tokyo (JP)

(72) Inventors: Taichi Okano, Yokohama Kanagawa
(JP); Shinra Yamanaka, Yokohama
Kanagawa (JP); Yoshihiro Amemiya,
Chigasaki Kanagawa (JP); **Nobuhiro
Yamamoto**, Yokohama Kanagawa (JP);
Hayato Yamaguchi, Sagamihara
Kanagawa (JP)

(73) Assignees: Kabushiki Kaisha Toshiba, Kawasaki
(JP); **Toshiba Electronic Devices &
Storage Corporation**, Kawasaki (JP)

( * ) Notice: Subject to any disclaimer, the term of this
patent is extended or adjusted under 35
U.S.C. 154(b) by 16 days.

(21) Appl. No.: 18/824,289

(22) Filed: Sep. 4, 2024

(65) Prior Publication Data

US 2025/0210061 A1 Jun. 26, 2025

(30) Foreign Application Priority Data

Dec. 25, 2023 (JP) ................................. 2023-217898

(51) Int. Cl.
| | |
|---|---|
| *G11B 5/48* | (2006.01) |
| *H05K 1/02* | (2006.01) |
| *H05K 1/189* | (2026.01) |
| *H05K 3/306* | (2026.01) |

(52) U.S. Cl.
CPC ......... *G11B 5/4853* (2013.01); *H05K 1/0219*
(2013.01); *H05K 1/189* (2013.01); *H05K
3/306* (2013.01); *H05K 2201/10159* (2013.01)

(58) Field of Classification Search
None
See application file for complete search history.

(56) References Cited

U.S. PATENT DOCUMENTS

| | | | | |
|---|---|---|---|---|
| 5,583,720 A | | 12/1996 | Ishida et al. | |
| 5,838,519 A | * | 11/1998 | Takizawa | G11B 5/486 |
| | | | | 360/245.9 |
| 5,859,746 A | | 1/1999 | Ishida et al. | |

(Continued)

FOREIGN PATENT DOCUMENTS

| | | |
|---|---|---|
| JP | H6-162407 A | 6/1994 |
| JP | H7-226040 A | 8/1995 |

(Continued)

*Primary Examiner* — William J Klimowicz
(74) *Attorney, Agent, or Firm* — Kim & Stewart LLP

(57) ABSTRACT

A disk device according to one embodiment includes a
magnetic disk, a magnetic head, an FPC, and a chip. The
FPC includes an insulating layer, a first conductive layer on
a first face of the insulating layer, and a second conductive
layer on a second face of the insulating layer. The chip is
mounted on the FPC. The first conductive layer includes
pads. The chip includes terminals connected to the plurality
of pads via solder. The second conductive layer includes
wires. The plurality of wires include at least either one or
two or more first wires or one or two or more pairs of second
wires. The first wires each include a first part disposed apart
from the pads, and a second part having a larger width than
the first part, overlapping one of the pads. The second wires
overlap one of the pads.

16 Claims, 7 Drawing Sheets

(56)          References Cited

U.S. PATENT DOCUMENTS

| | | | | |
|---|---|---|---|---|
| 6,166,888 | A | 12/2000 | Tsuda et al. | |
| 8,934,199 | B1 * | 1/2015 | Pan ........................ | G11B 5/486 |
| | | | | 360/245.4 |
| 11,205,448 | B2 * | 12/2021 | Sato ..................... | G11B 5/4853 |
| 11,646,056 | B2 | 5/2023 | Sato | |
| 2018/0277150 | A1 * | 9/2018 | Kikuchi ................. | H05K 1/028 |
| 2019/0295600 | A1 * | 9/2019 | Yoshikawa .......... | G11B 5/4853 |
| 2023/0206957 | A1 * | 6/2023 | Tokuda .................... | G11B 5/54 |
| 2024/0040696 | A1 * | 2/2024 | Amemiya .............. | H05K 3/103 |

FOREIGN PATENT DOCUMENTS

| | | | |
|---|---|---|---|
| JP | H8-287409 | A | 11/1996 |
| JP | H10-241133 | A | 9/1998 |
| JP | 2008-165880 | A | 7/2008 |
| JP | 2021-48272 | A | 3/2021 |
| JP | 2023-95278 | A | 7/2023 |

* cited by examiner

FIG.5

DISK DEVICE WITH FPC AND CHIP

CROSS-REFERENCE TO RELATED APPLICATIONS

This application is based upon and claims the benefit of priority from Japanese Patent Application No. 2023-217898, filed on Dec. 25, 2023; the entire contents of which are incorporated herein by reference.

FIELD

Embodiments described herein relate generally to a disk device.

BACKGROUND

Disk devices such as a hard disk drive generally include various kinds of components such as magnetic heads, a flexible printed circuit board, and microchips (chips). The magnetic heads are electrically connected to the flexible printed circuit board to read and write information from and to the magnetic disks. The chips are mounted on pads of the flexible printed circuit board using solder.

The flexible printed circuit board includes a plurality of insulating layers and a plurality of conductive layers. The flexible printed circuit board has an uneven thickness, with the part including the pads non-overlapping another conductive layer thinner in thickness than the part including the pads overlapping another conductive layer. Namely, the pads non-overlapping another conductive layer are further away from the chips than the pads overlapping another conductive layer.

During reflow, the solder between the pad and the chip relatively far from each other applies larger surface tension to pull the chip toward the flexible printed circuit board than the solder between the pad and the chip close to each other. Such imbalance of the surface tension may cause the chips to be inclined.

BRIEF DESCRIPTION OF THE DRAWINGS

FIG. 5 is an exemplary cross-sectional view of the FPC and a preamplifier of the first embodiment taken along line F5-F5 in FIG. 4;

DETAILED DESCRIPTION

A disk device according to one embodiment includes a magnetic disk, a magnetic head, a flexible printed circuit board, and a chip.

The magnetic head is configured to read and write information from and to the magnetic disk. The flexible printed circuit board is electrically connected to the magnetic head.

The flexible printed circuit board includes an insulating layer, a first conductive layer disposed on a first face of the insulating layer, and a second conductive layer disposed on a second face of the insulating layer, the second face being opposite the first face. The chip is mounted on the flexible printed circuit board. The first conductive layer includes a plurality of pads. The chip includes a plurality of terminals connected to the plurality of pads via solder. The second conductive layer includes a plurality of wires. The plurality of wires include at least either one or two or more first wires or one or two or more pairs of second wires. The one or two or more first wires each include a first part disposed apart from the plurality of pads along the second face, and a second part having a larger width than the first part, overlapping one of the plurality of pads with the insulating layer interposed in-between the second part and the one pad, and isolated from the one pad by the insulating layer. The one or two or more pairs of second wires each overlap one of the plurality of pads, with the insulating layer interposed in-between the one pad and the second wire pair or pairs.

First Embodiment

Hereinafter, a first embodiment will be described with reference to FIGS. 1 to 5. Note that constituent elements according to embodiments and descriptions of the elements are described in a plurality of expressions in some cases. The constituent elements and the descriptions thereof are merely examples and are not limited by the expressions in the present specification. The constituent elements can also be identified by names different from those in the present specification. In addition, the constituent elements can also be described by expressions different from those in the present specification.

In the following description, "suppressing" is defined as, for example, preventing the occurrence of an event, action, or influence, or reducing the degree of the event, the action, or the influence. In addition, in the following description, "restricting" is defined as, for example, preventing movement or rotation, or allowing movement or rotation within a predetermined range and preventing movement or rotation beyond the predetermined range.

Figure 1:
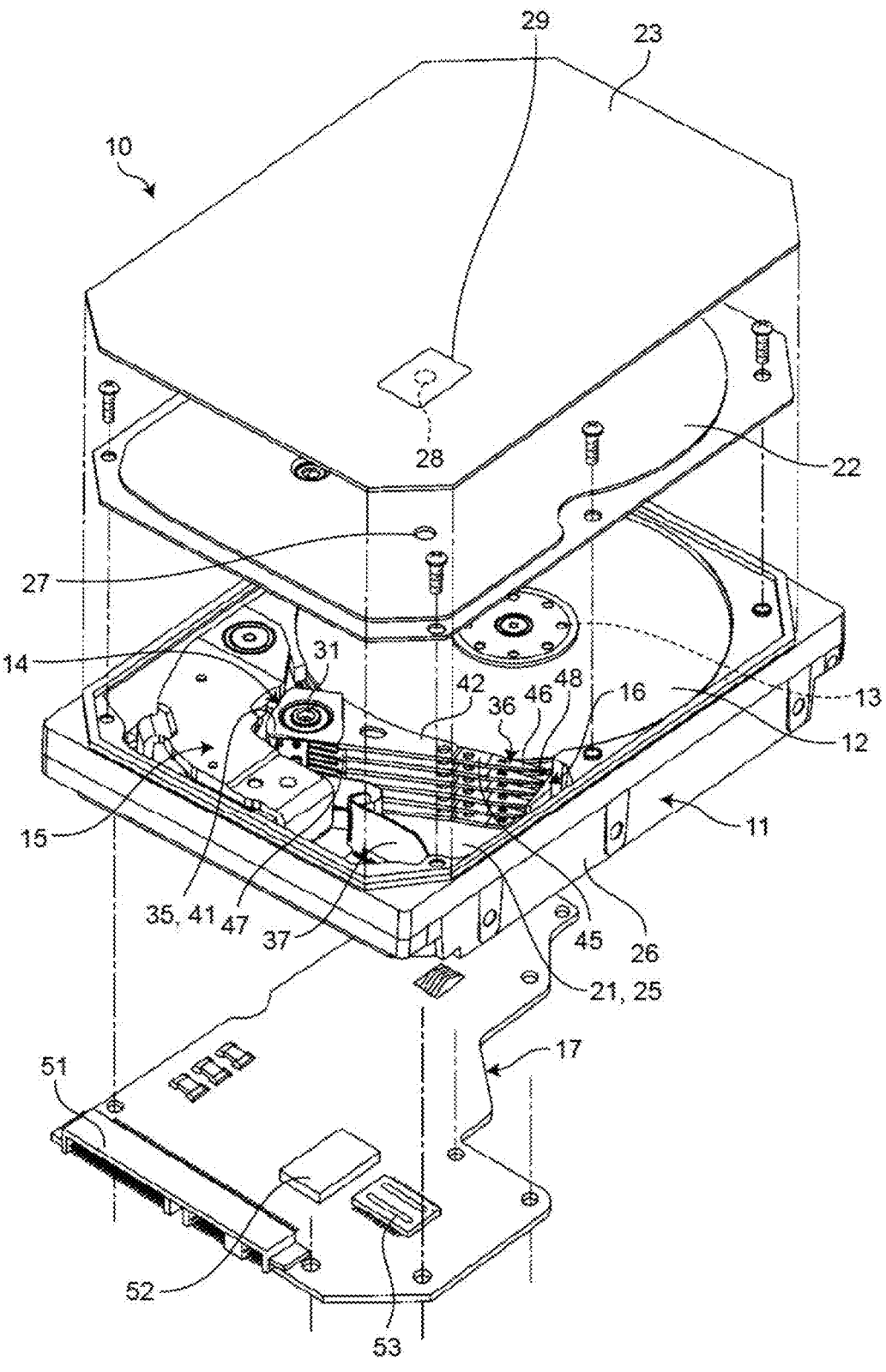
FIG. 1 is an exemplary perspective view illustrating an HDD according to a first embodiment in an exploded manner.

FIG. 1 is an exemplary perspective view illustrating a hard disk drive (HDD) 10 according to the first embodiment in an exploded manner. The HDD 10 is an example of a disk device, and can also be referred to as an electronic device, a storage device, an external storage device, or a magnetic disk device. Note that the disk device is not limited to the HDD 10.

As illustrated in FIG. 1, the HDD 10 includes a case 11, a plurality of magnetic disks 12, a spindle motor 13, a head stack assembly (HSA) 14, a voice coil motor (VCM) 15, a ramp load mechanism 16, and a printed circuit board (PCB) 17. The magnetic disk 12 may also be referred to as a disk, a medium, or a platter.

The case 11 has a base 21, an inner cover 22, and an outer cover 23. Note that the case 11 is not limited to this example. The base 21 has a substantially rectangular parallelepiped box shape open in one direction. The base 21 accommodates the plurality of magnetic disks 12, the spindle motor 13, the HSA 14, the VCM 15, and the ramp load mechanism 16.

The base 21 has a bottom wall 25 and a side wall 26. The bottom wall 25 has a substantially rectangular (quadrangular) plate shape. The side wall 26 protrudes from an edge of the bottom wall 25 and has a substantially rectangular frame shape. The inner cover 22 is attached to an end portion of the side wall 26 with, for example, a screw to close the base 21.

The outer cover 23 covers the inner cover 22 and is attached to the end portion of the side wall 26 by welding, for example.

The inner cover 22 is provided with a vent 27. Further, the outer cover 23 is provided with a vent 28. After components are attached to the inside of the base 21 and the inner cover 22 and the outer cover 23 are attached to the base 21, air inside the case 11 is evacuated from the vents 27 and 28. Further, the inside of the case 11 is filled with a gas different from air.

Examples of the gas with which the inside the case 11 is filled include a low-density gas having a lower density lower than air, an inert gas having a low reactivity, and the like. For example, the inside of the case 11 is filled with helium. Note that the inside of the case 11 may be filled with other fluids.

The vent 28 of the outer cover 23 is closed by a seal 29. The seal 29 hermetically seals the vent 28 and restricts a fluid with which the case 11 is filled from leaking from the vent 28 to the outside of the case 11.

The plurality of magnetic disks 12 are arranged substantially parallel to the bottom wall 25. The plurality of magnetic disks 12 are aligned at intervals. The spindle motor 13 supports the plurality of magnetic disks 12. The plurality of magnetic disks 12 are held in a hub of the spindle motor 13 by, for example, a clamp spring. The spindle motor 13 rotates the plurality of magnetic disks 12.

The case 11 is provided with a support shaft 31 separated from the magnetic disk 12. The support shaft 31 extends from the bottom wall 25 of the case 11, for example. The HSA 14 is rotatably supported by the support shaft 31.

The HSA 14 has a carriage 35, a plurality of head gimbal assemblies (HGA) 36, and a flexible printed circuit board (FPC) 37. The carriage 35 includes an actuator block 41 and a plurality of arms 42.

The actuator block 41 is supported by the support shaft 31 via a bearing so as to be rotatable about the support shaft 31, for example. The plurality of arms 42 protrude substantially in parallel from the actuator block 41.

The plurality of arms 42 are aligned at intervals. Each of the plurality of arms 42 can enter a gap between two adjacent magnetic disks 12 among the plurality of magnetic disks 12.

The VCM 15 includes a voice coil attached to the carriage 35, a pair of yokes, and magnets provided on the yokes. The VCM 15 rotates the carriage 35 about the support shaft 31.

Each of the plurality of HGAs 36 includes a base plate 45, a load beam 46, a flexure 47, and a magnetic head 48. The base plate 45 is attached to a distal end of the arm 42. The load beam 46 is thinner in thickness than the base plate 45 and extends from the base plate 45.

The flexure 47 has an elongated strip shape. Note that the shape of the flexure 47 is not limited to this example. The flexure 47 is a kind of FPC including a metal plate (backing layer) such as stainless steel, an insulating layer (base layer) formed on the metal plate, a conductive layer formed on the insulating layer and forming a plurality of wirings (wiring patterns), and an insulating layer (cover layer) covering the conductive layer.

A gimbal (elastic support), which is located above the load beam 46 and is displaceable, is provided at one end of the flexure 47. The magnetic head 48 is mounted on the gimbal of the flexure 47. The magnetic head 48 records and reproduces information on a recording layer of the magnetic disk 12. In other words, the magnetic head 48 reads and writes information from and to the magnetic disk 12.

The VCM 15 rotates the carriage 35 to arrange a magnetic head 48 at a desired position on the magnetic disk 12. When the magnetic head 48 moves to the outermost circumference of the magnetic disk 12, the ramp load mechanism 16 holds the magnetic head 48 at an unload position apart from the magnetic disk 12.

The other end of the flexure 47 is connected to the FPC 37. For example, a plurality of flexures 47 are connected to the FPC 37. As a result, the FPC 37 is electrically connected to a plurality of magnetic heads 48 via the wiring of the plurality of flexures 47.

The PCB 17 is, for example, a rigid substrate such as a glass epoxy substrate, a multi-layer substrate, or a build-up substrate. The PCB 17 is arranged outside the case 11 and is attached to the bottom wall 25 of the base 21. The PCB 17 is attached to the bottom wall 25 by, for example, a plurality of screws.

The HDD 10 further includes, for example, an interface (I/F) connector 51, a controller 52, and a relay connector 53. The I/F connector 51, the controller 52, and the relay connector 53 are mounted on the PCB 17. In addition, other components may be mounted on the PCB 17.

The I/F connector 51 is a connector that conforms to an interface standard such as Serial ATA (SATA), and is connected to an I/F connector of a host computer. The controller 52 is, for example, a system-on-chip (SoC), and includes a read/write channel (RWC), a hard disk controller (HDC), and a processor.

The PCB 17 is electrically connected to various components arranged inside the case 11 through the relay connector 53. For example, the PCB 17 is electrically connected to the spindle motor 13, the VCM 15, the FPC 37, and the magnetic head 48.

Figure 2:
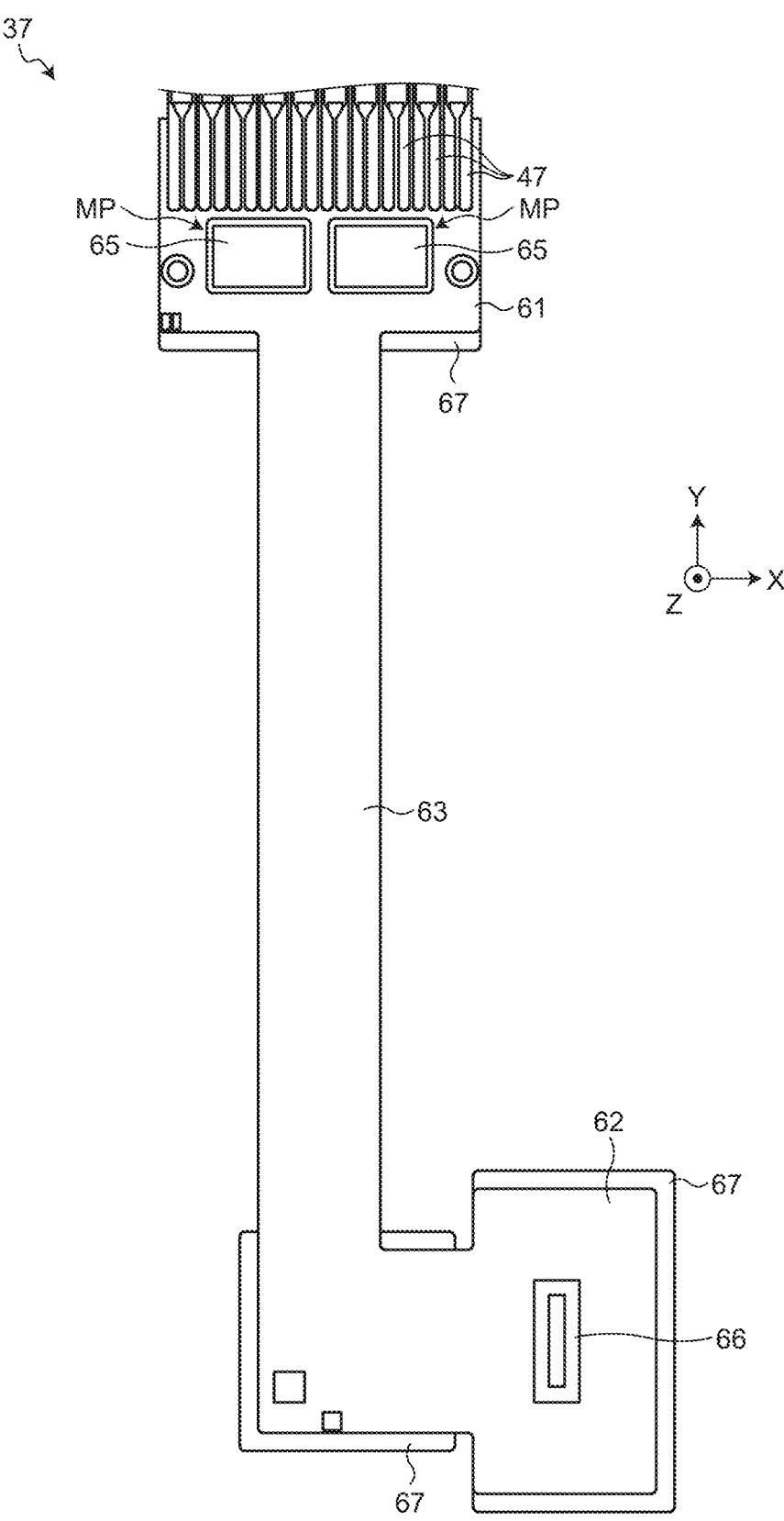
FIG. 2 is an exemplary plan view schematically illustrating an FPC of the first embodiment.

FIG. 2 is an exemplary plan view schematically illustrating the FPC 37 of the first embodiment. As illustrated in FIG. 2, the FPC 37 is detached from the other components and has a substantially L-shaped strip shape in a natural state where no external force acts. Note that the shape of the FPC 37 is not limited to this example. The FPC 37 has a first connection part 61, a second connection part 62, and an intermediate part 63.

The first connection part 61 is provided, for example, at one end of the FPC 37 in a direction in which the FPC 37 extends. The first connection part 61 is attached to the actuator block 41 by, for example, a screw. The first connection part 61 is connected to the plurality of flexures 47.

The second connection part 62 is provided, for example, at the other end of the FPC 37 in the direction in which the FPC 37 extends. The second connection part 62 is attached to the bottom wall 25 with, for example, a screw. The second connection part 62 is, for example, electrically connected to the relay connector 53 on the PCB 17.

The intermediate part 63 is provided between the first connection part 61 and the second connection part 62. The intermediate part 63 extends in a strip shape and is bent between the first connection part 61 and the second connection part 62 in accordance with rotation of the actuator block 41.

In the present specification, an X axis, a Y axis, and a Z axis are defined for convenience as illustrated in the drawings. The X axis, the Y axis, and the Z axis are orthogonal to each other. The X axis is provided along a width of the intermediate part 63 in the natural state. The Y axis is provided along a length of the intermediate part 63 in the natural state. The Z axis is provided along a thickness of the FPC 37 in the natural state.

Further, an X direction, a Y direction, and a Z direction are defined in the present specification. The X direction is a direction along the X axis and includes a +X direction indicated by an arrow of the X axis and a −X direction which is an opposite direction of the arrow of the X axis. The Y direction is a direction along the Y axis, and includes a +Y direction indicated by an arrow of the Y axis and a −Y direction which is an opposite direction of the arrow of the Y axis. The Z direction is a direction along the Z axis and includes a +Z direction indicated by an arrow of the Z axis and a −Z direction which is an opposite direction of the arrow of the Z axis.

The first connection part 61 is connected to an end of the intermediate part 63 in the +Y direction and extends in the +Y direction from the end. The second connection part 62 is connected to an end of the intermediate part 63 in the −Y direction and extends in the +X direction from the end. Note that the first connection part 61 and the second connection part 62 are not limited to this example.

The HDD 10 further includes a plurality of preamplifiers 65, a relay connector 66, and a plurality of reinforcing plates 67. The preamplifier 65 is an example of a chip and may also be referred to as a head IC, an IC, a microchip, an electronic device, or an electronic component. The preamplifier 65 is mounted on the first connection part 61 of the FPC 37.

The preamplifiers 65 are electrically connected to the magnetic heads 48 via the FPC 37 and the flexures 47. For example, the preamplifier 65 amplifies a write signal output from the controller 52 and outputs the amplified write signal to the magnetic head 48. The write signal is an electrical signal representing information to be written to the magnetic disk 12 by the magnetic head 48. Further, the preamplifier 65 receives a read signal from the magnetic head 48, amplifies the read signal, and outputs the amplified read signal to the controller 52. The read signal is an electrical signal representing information read from the magnetic disk 12 by the magnetic head 48. The preamplifier 65 may receive and output various other electrical signals.

The relay connector 66 is mounted on the second connection part 62 of the FPC 37. The relay connector 66 is electrically connected to the relay connector 53 of the PCB 17 via, for example, a relay substrate provided on the bottom wall 25.

The reinforcing plate 67 is made of, for example, metal such as aluminum or a synthetic resin. Note that the reinforcing plate 67 is not limited to this example. The plurality of reinforcing plates 67 are attached to the first connection part 61 and the second connection part 62.

The reinforcing plate 67 has higher rigidity than the FPC 37. Therefore, the reinforcing plate 67 improves the rigidity of the first connection part 61 and the second connection part 62. At least a part of the intermediate part 63 is not attached to the reinforcing plate 67 and can be bent.

Figure 3:
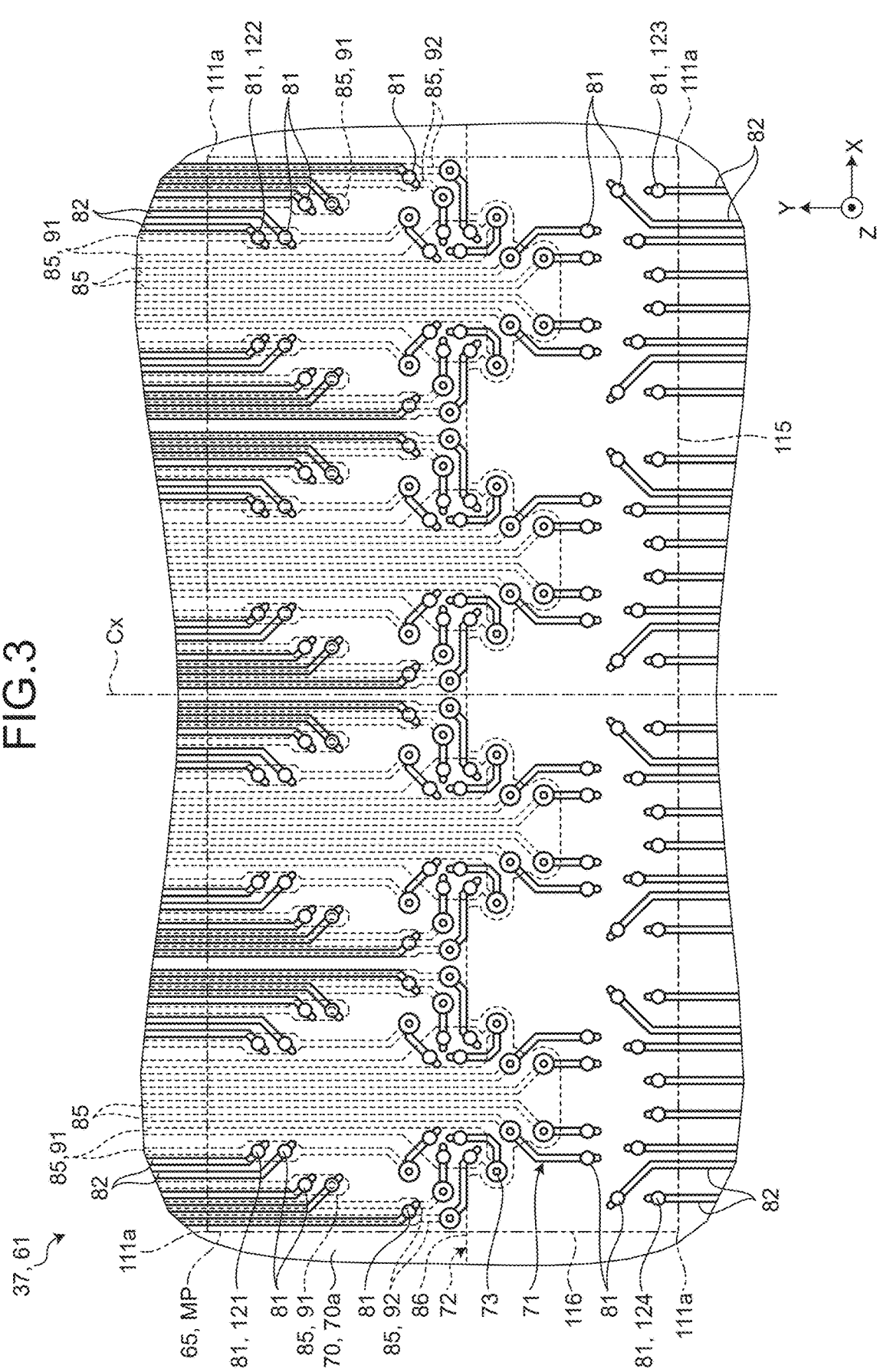
FIG. 3 is an exemplary plan view illustrating a mount of the FPC of the first embodiment.

FIG. 3 is an exemplary plan view illustrating a mount MP of the FPC 37 of the first embodiment. The FPC 37 includes a plurality of the mounts MP. The mount MP is a portion of the first connection part 61 of the FPC 37 on which the preamplifier 65 is mounted. In other words, the mount MP is a portion overlapping (covered by) the preamplifier 65 in the Z direction in the first connection part 61. FIG. 3 illustrates an outer shape of the preamplifier 65 projected in the Z direction by a two-dot chain line.

Figure 4:
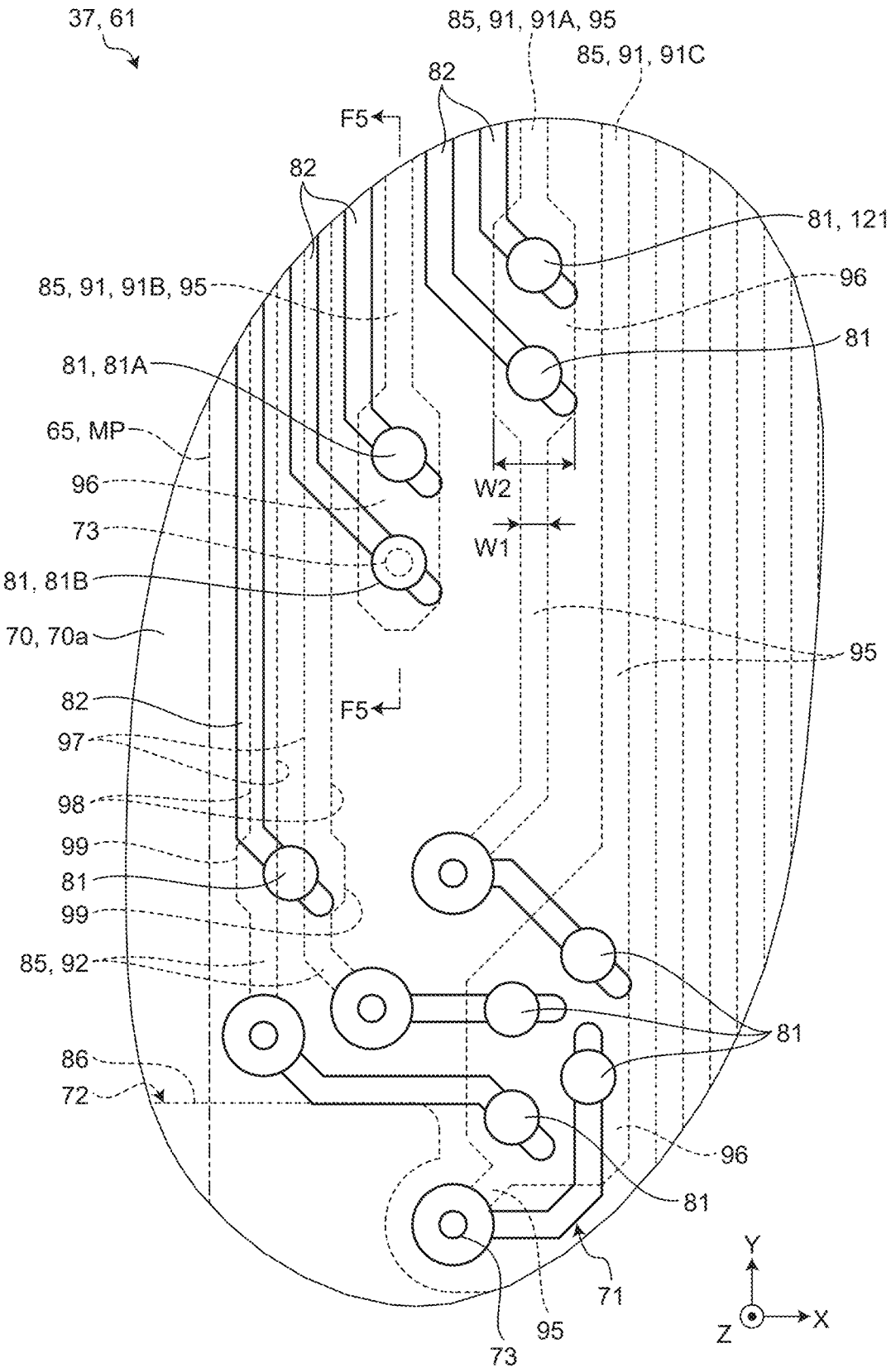
FIG. 4 is an exemplary plan view illustrating a part of the mount of the first embodiment.
Figure 5:
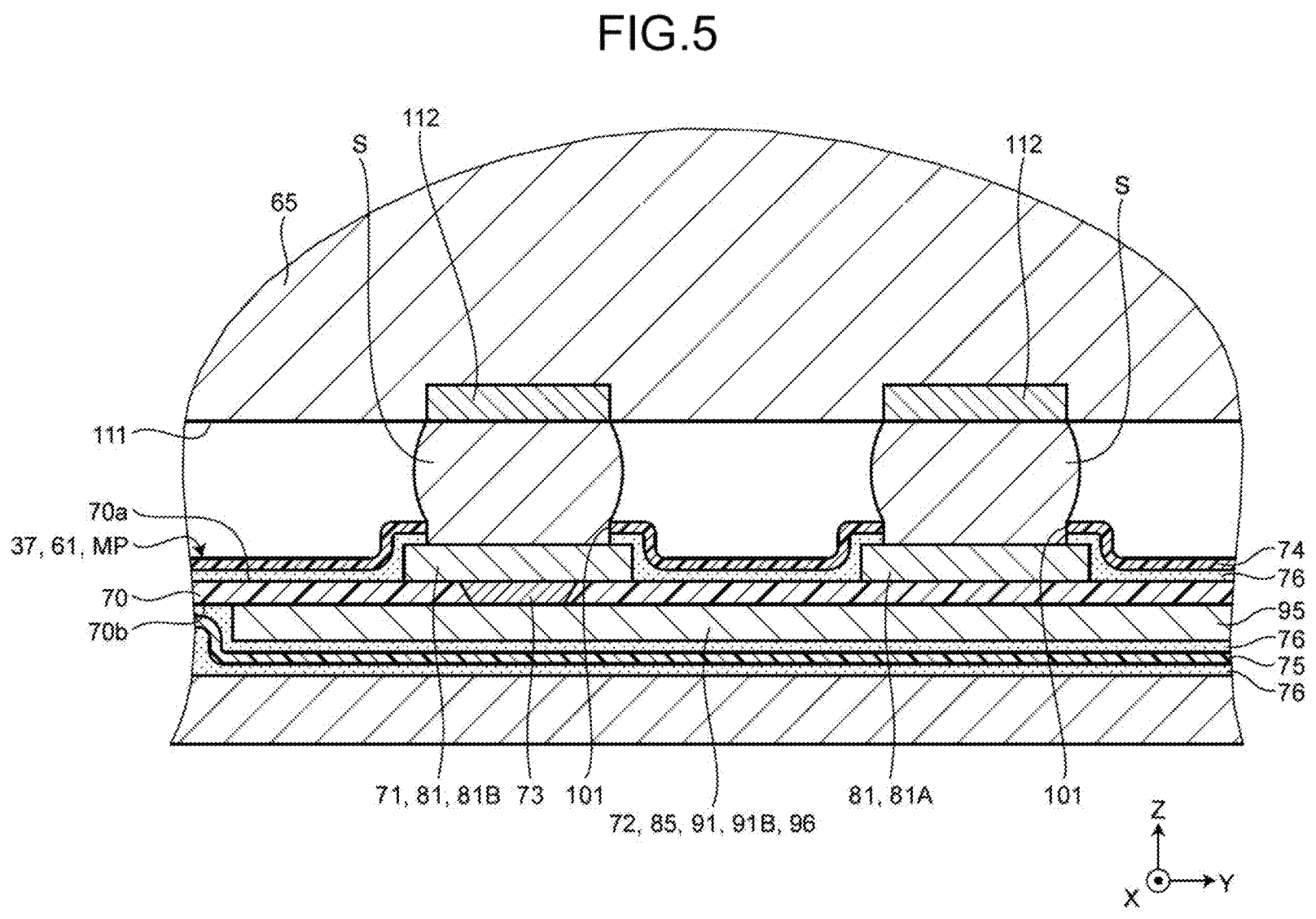

FIG. 4 is an exemplary plan view illustrating a part of the mount MP of the first embodiment. FIG. 5 is an exemplary cross-sectional view of the FPC 37 and the preamplifier 65 of the first embodiment taken along line F5-F5 in FIG. 4. As illustrated in FIG. 5, the FPC 37 includes a base layer 70, a first conductive layer 71, a second conductive layer 72, a plurality of vias 73, a first cover layer 74, a second cover layer 75, and a plurality of adhesive layers 76. Note that the FPC 37 may have three or more conductive layers. The base layer 70 is an example of an insulating layer. Note that the first cover layer 74 is omitted for understanding in FIGS. 3 and 4.

The base layer 70, the first cover layer 74, and the second cover layer 75 are made of an insulating synthetic resin such as polyimide (PI). Note that materials of the base layer 70, the first cover layer 74, and the second cover layer 75 are not limited to this example.

The base layer 70 has a first face 70a and a second face 70b. The first face 70a faces substantially in the +Z direction. The second face 70b is opposite the first face 70a and faces substantially in the −Z direction. The second face 70b faces the actuator block 41.

The first conductive layer 71, the second conductive layer 72, and the via 73 are made of, for example, a conductive metal such as copper. Note that materials of the first conductive layer 71, the second conductive layer 72, and the via 73 are not limited to this example. The first conductive layer 71 and the second conductive layer 72 form a wiring pattern.

The first conductive layer 71 is disposed on the first face 70a of the base layer 70. As illustrated in FIG. 4, the first conductive layer 71 includes a plurality of pads 81 and a plurality of wires 82. The pad 81 may also be referred to as, for example, a land, an electrode, or a terminal.

The pads 81 are electrodes disposed on the mount MP. Each of the plurality of pads 81 has, for example, a substantially circular shape. Note that the shape of the pad 81 is not limited to this example. The first conductive layer 71 further includes a plurality of other pads provided outside the mount MP. Each of the plurality of wires 82 connects at least two of the plurality of pads 81 provided on the mount MP, the plurality of other pads provided outside the mount MP, and the plurality of vias 73.

As illustrated in FIG. 5, the second conductive layer 72 is disposed on the second face 70b of the base layer 70. As illustrated in FIG. 4, the second conductive layer 72 includes a plurality of wires 85 and a ground plane 86. Each of the plurality of wires 85 connects at least two of the plurality of vias 73 together.

As illustrated in FIG. 5, the via 73 penetrates through the base layer 70 and connects the first conductive layer 71 and the second conductive layer 72. For example, each of the plurality of vias 73 connects one of the plurality of wires 82 of the first conductive layer 71 and one of the plurality of wires 85 of the second conductive layer 72.

As illustrated in FIG. 3, the wires 85 of the second conductive layer 72 include a plurality of first wires 91 and a plurality of pairs of second wires 92. Note that the number of the first wires 91 and the number of the second wires 92 are not limited to this example. The wires 85 include at least either the first wire 91 or the pair of second wires 92.

As illustrated in FIG. 4, each of the plurality of first wires 91 includes at least one narrower part 95 and a wider part 96. The narrower part 95 is an example of a first part. The wider part 96 is an example of a second part. The first wire 91 may have a plurality of narrower parts 95 and a plurality of wider parts 96.

The narrower part 95 is a relatively narrow part of the first wire 91. For example, a width W1 of the narrower part 95 is smaller than a diameter of the pad 81 and is, for example, about 29 μm. Note that the width W1 of the narrower part 95 is not limited to this example. The width is a dimension of each portion of the wires 82 and 85 in a direction orthogonal to a direction in which the portion extends.

In the present embodiment, the narrower part 95 is disposed apart from the pad 81 along the second face 70b.

In other words, the narrower part 95 does not overlap the pad 81 with the base layer 70 interposed therebetween. Note that the narrower part 95 may overlap other pads outside the mount MP.

The wider part 96 is a relatively wide part of the first wire 91. That is, the wider part 96 is larger in width than the narrower part 95. For example, a width W2 of the wider part 96 is the same as or wider than the diameter (width) of the pad 81. Note that the width W2 of the wider part 96 is not limited to this example.

The wider parts 96 of the plurality of first wires 91 each overlap at least one of the plurality of pads 81 with the base layer 70 interposed therebetween. In other words, the wider part 96 covers at least one of the plurality of pads 81 through the base layer 70 in the Z direction.

The plurality of first wires 91 include first wires 91A, 91B, and 91C. The plurality of first wires 91 may include other first wires 91 different from the first wires 91A, 91B, and 91C.

The first wire 91A has two narrower parts 95 and one wider part 96. One of the narrower parts 95 is an example of the first part and the other narrower part 95 is an example of a third part. In the first wire 91A, the wider part 96 overlaps two adjacent pads 81 among the plurality of pads 81 with the base layer 70 interposed therebetween. The wider part 96 is isolated from the two pads 81 by the base layer 70. In other words, the wider part 96 and the pad 81 are not connected to each other through the via 73. Note that the wider part 96 and the pad 81 may be electrically connected to each other via, for example, the narrower part 95 and the via 73.

In the first wire 91A, the two narrower parts 95 are spaced from each other substantially in the Y direction. The wider part 96 extends and connects between the two narrower parts 95. The wider part 96 extends substantially in the Y direction between the two narrower parts 95. The two pads 81 overlapping the wider part 96 are juxtaposed with an interval substantially in the Y direction.

The first wire 91B has one narrower part 95 and one wider part 96. In the first wire 91B, the wider part 96 overlaps two adjacent pads 81A and 81B among the plurality of pads 81 with the base layer 70 interposed therebetween.

As illustrated in FIG. 5, in the first wire 91B, the wider part 96 is spaced apart from the pad 81A by the base layer 70. Meanwhile, the via 73 connects the pad 81B and the wider part 96. That is, the pad 81B is a pad-on-via.

As illustrated in FIG. 4, in the first wire 91B, the wider part 96 extends substantially in the −Y direction from an end portion of the narrower part 95. The pads 81A and 81B are aligned in the Y direction at an interval. The pad 81B is more distant from the narrower part 95 than the pad 81A and is located at an end of the first wire 91B.

The first wire 91C has two narrower parts 95 and one wider part 96. In the first wire 91C, the wider part 96 overlaps four pads 81, adjacent to each other among the plurality of pads 81, with the base layer 70 interposed therebetween. The wider part 96 is spaced apart from the four pads 81 by the base layer 70. Note that one of the four pads 81 may be connected to the wider part 96 by the via 73.

In the first wire 91C, the two narrower parts 95 are separated from each other substantially in the Y direction. The wider part 96 is located between the two narrower parts 95 and connected to the two narrower parts 95. The wider part 96 has a substantially quadrangular shape between the two narrower parts 95. The width of the wider part 96 is larger than twice the diameter of the pad 81. The four pads 81 overlapping the wider part 96 are aligned in two rows in the Y direction at intervals.

As illustrated in the first wires 91A, 91B, and 91C, the number of the pads 81 overlapping the wider part 96 is not limited. For example, the wider part 96 may overlap three, five, or more pads 81, or may overlap one pad 81. In addition, the wider part 96 may extend in substantially the same direction as a direction in which the narrower part 95 extends, may have a quadrangular shape, a triangular shape, or another geometric shape, or may curve.

Each of the plurality of pairs of second wires 92 overlaps at least one of the plurality of pads 81 with the base layer 70 interposed therebetween. Note that three or more second wires 92 may overlap the pad 81 with the base layer 70 interposed therebetween.

In the present embodiment, the pair of second wires 92 extends substantially in parallel, overlapping at least one pad 81. In other words, portions of the two second wires 92 extending substantially in parallel overlap the pad 81 with the base layer 70 interposed therebetween. Note that a direction in which the pair of second wires 92 extends is not limited to this example.

The pair of second wires 92 may extend in directions different from each other at positions separated from the pad 81 along the second face 70b. That is, the pair of second wires 92 only needs to overlap at least one common pad 81, and may be two second wires 92 having no other correlation.

In the present embodiment, of at least one of the plurality of pairs of second wires 92, the part overlapping the pad 81 with the base layer 70 interposed therebetween is larger in width than the part disposed apart from the pad 81 along the second face 70b. Among the plurality of pairs of second wires 92, at least one pair of second wires 92 each have a first edge 97, a second edge 98, and an extended part 99.

The first edge 97 faces the other second wire 92. That is, the first edge 97 of one second wire 92 and the first edge 97 of the other second wire 92 face each other with an interval at a position overlapping the pad 81.

The second edge 98 is opposite the first edge 97. The second edge 98 extends in substantially parallel to the first edge 97. The second edge 98 is separated from the pad 81 overlapping the pair of second wires 92 along the second face 70b.

The interval between the pair of second wires 92 at the position overlapping the pad 81 is about 29 μm. The interval between the pair of second wires 92 is a distance between the first edge 97 of the one second wire 92 and the first edge 97 of the other second wire 92.

A width of the second wire 92 at a position separated from the pad 81 along the second face 70b is about 29 μm. The width of the second wire 92 is a distance between the first edge 97 and the second edge 98. Note that the interval and the width of the second wires 92 are not limited to the above examples.

The extended part 99 protrudes from the second edge 98. That is, at the location of the extended part 99, the pair of second wires 92 each have a larger width than the interval between the pair of second wires 92. The extended part 99 overlaps the pad 81 with the base layer 70 interposed therebetween. Note that a pair of second wires 92 having a constant width may overlap the pad 81 without the extended part 99.

The ground plane 86 is set to, for example, a ground potential. As illustrated in FIG. 3, the ground plane 86 is separated from the wires 85. The ground plane 86 overlaps at least one of the plurality of pads 81 with the base layer 70 interposed therebetween.

As illustrated in FIG. 5, the first cover layer 74 covers the first face 70*a* of the base layer 70 and the wire 82 of the first conductive layer 71. For example, the adhesive layer 76 attach the first cover layer 74 to the first face 70*a* and the wire 82.

The first cover layer 74 is provided with a plurality of holes 101. The plurality of holes 101 penetrate through the first cover layer 74. The plurality of pads 81 of the first conductive layer 71 are exposed to the outside of the FPC 37 through the holes 101. The exposed surface of the pad 81 is plated, for example.

The second cover layer 75 covers the second face 70*b* of the base layer 70 and the second conductive layer 72. For example, the adhesive layer 76 attaches the second cover layer 75 to the second face 70*b* and the second conductive layer 72.

The second cover layer 75 is attached to the reinforcing plate 67 by the adhesive layer 76. The reinforcing plate 67 is located between the actuator block 41 and the second cover layer 75 and maintains a shape of the first connection part 61.

The preamplifier 65 has a bottom face 111 and a plurality of terminals 112. The bottom face 111 has a rectangular (quadrangular) shape and faces the mount MP of the FPC 37 with a gap. The plurality of terminals 112 are disposed on the bottom face 111.

The preamplifier 65 is mounted on the mount MP by, for example, flip-chip mounting. Each of the plurality of terminals 112 is connected to a corresponding one of the plurality of pads 81 via solder S. The solder S is a solder bump.

As illustrated in FIG. 3, the preamplifier 65 further includes a first lateral face 115 and a second lateral face 116. The first lateral face 115 is an end face of the preamplifier 65 in the −Y direction and extends substantially in the X direction. The X direction is a direction along the first face 70*a*, and is an example of a first direction. The second lateral face 116 is an end face of the preamplifier 65 in the −X direction and extends substantially in the Y direction. The Y direction is a direction along the first face 70*a* and orthogonal to (intersecting) the X direction, and is an example of a second direction.

In the present embodiment, each of the plurality of pads 81 overlaps one of the plurality of first wires 91, one of the plurality of pairs of second wires 92, or the ground plane 86 with the base layer 70 interposed therebetween. Because of this, at the locations of the plurality of pads 81, the FPC 37 have approximately the same thickness. Note that the pads placed outside the mount MP may not overlap the second conductive layer 72.

In the present embodiment, among the plurality of pads 81, the pad 81 that transmits the write signal or the read signal overlaps, for example, the ground plane 86 with the base layer 70 interposed therebetween. The first wire 91, the second wire 92, and the pad 81 overlapping the first wire 91 or the second wire 92 transmit an electrical signal different from the write signal and the read signal. Examples of the electrical signal different from the write signal and the read signal include an output signal of a touch sensor, a control signal for a laser element of heat assisted magnetic recording (HAMR), a control signal for an oscillation element of microwave assisted magnetic recording (MAMR), or a control signal for a heater. Note that the pad 81, the first wire 91, and the second wire 92 are not limited to this example.

In the present embodiment, the plurality of pads 81 are arranged symmetrically with respect to a middle Cx of the preamplifier 65 in the X direction. For example, each of the plurality of pads 81 at least partially overlaps one corresponding pad 81 by being reversed with respect to the middle Cx. That is, the symmetrical arrangement of the two pads 81 may not be completely symmetrical with respect to the middle Cx. Note that the arrangement of the plurality of pads 81 is not limited to this example.

The plurality of pads 81 include four corner pads 121, 122, 123, and 124. The corner pads 121 to 124 are four pads closest to four corners 111*a* of the bottom face 111 of the preamplifier 65 among the plurality of pads 81. The corner pads 121 to 124 may overlap any of the first wire 91, the second wire 92, and the ground plane 86.

In the present embodiment, differences between distances between the four corner pads 121 to 124 and the preamplifier 65 and an average value of the distances are within a range of ±8% of the average value.

For example, the distance between the corner pad 121 and the preamplifier 65 is 47.8 μm, the distance between the corner pad 122 and the preamplifier 65 is 51.8 μm, the distance between the corner pad 123 and the preamplifier 65 is 51.5 μm, and the distance between the corner pad 124 and the preamplifier 65 is 50.9 μm. In this case, the average value is 50.5 μm, and the difference between each of the distances and the average value is −5.35 to 2.57% of the average value.

In the HDD 10 according to the first embodiment described above, the HDD 10 includes the magnetic disk 12, the magnetic head 48, the FPC 37, and the preamplifier 65. The magnetic head 48 is configured to read and write information from and to the magnetic disk 12. The FPC 37 includes the base layer 70, the first conductive layer 71, and the second conductive layer 72. The first conductive layer is disposed on the first face 70*a* of the base layer 70. The second conductive layer is disposed on the second face 70*b* of the base layer 70. The second face 70*b* is opposite the first face 70*a*. The FPC 37 is electrically connected to the magnetic head 48. The preamplifier 65 is mounted on the FPC 37. The first conductive layer 71 includes the plurality of pads 81. The preamplifier 65 includes the plurality of terminals 112 connected to the plurality of pads 81 via the solder S. The second conductive layer 72 includes the plurality of wires 85. The plurality of wires 85 include at least either at least one first wire 91 (the plurality of first wires 91 in the present embodiment) or at least one pair of second wires (the plurality of pairs of second wires 92 in the present embodiment). The first wire 91 has the narrower part 95 and the wider part 96. The narrower part 95 is disposed apart from the plurality of pads 81 along the second face 70*b*. The wider part 96 overlaps one of the plurality of pads 81 with the base layer 70 interposed therebetween, that is, the wider part 96 is isolated from the one pad 81 by the base layer 70. The wider part 96 is larger in width than the narrower part 95. The pair of second wires 92 overlaps one of the plurality of pads 81 with the base layer 70 interposed therebetween.

By including at least one pad 81 non-overlapping the second conductive layer 72, the FPC 37 has a non-uniform thickness, with the part including the non-overlapping pad 81 smaller in thickness than the part including the other pads 81 overlapping the second conductive layer 72. Namely, the non-overlapping pad 81 is farther from the preamplifier 65 than one of the plurality of pads 81 overlapping the second conductive layer 72. During reflow, the solder S between the pad 81 and the terminal 112 away from each other applies larger surface tension to bring the preamplifier 65 and the FPC 37 closer to each other than the solder S between the pad 81 and the terminal 112 close to each other. Such imbalance of the surface tension may cause the preamplifier 65 to be inclined with respect to the FPC 37, resulting in spread of the solder S between the pad 81 and the terminal 112 close to each other. However, the HDD 10 of the present embodiment enables the thickness adjustment of the FPC 37 by placing a desired pad or pads 81 to overlap the wider part 96 of the first wire 91 or the pair of second wires 92, thereby reducing or preventing the occurrence of tilting of the preamplifier 65. In the HDD 10 according to the present embodiment, the preamplifier 65 is unlikely to be inclined, leading to avoiding an event such as a short circuit, which would otherwise occur due to the spread solder S. As a result, the FPC 37 can be improved in terms of design flexibility.

The plurality of wires 85 include the first wires 91A, 91B, and 91C. Each of the first wires 91A, 91B, and 91C overlaps two adjacent pads 81 among the plurality of pads 81 with the base layer 70 interposed therebetween. As a result, each wider part 96 overlapping two adjacent pads 81 increases in width from when overlapping only one of the plurality of pads 81, to be able to stably support the plurality of pads 81. In this manner the HDD 10 of the present embodiment can implement stable thickness adjustment of the FPC 37.

The first wire 91A has two narrower parts 95. Each of the two narrower parts 95 is connected to the wider part 96 apart from the plurality of pads 81 along the second face 70*b*. The wider part 96 extends between the two narrower parts 95. The two adjacent pads 81 are juxtaposed with an interval in the Y direction in which the wider part 96 extends. Such a configuration leads to eliminating the necessity for the wider part 96 to have a significantly larger dimension than the diameter of each pad 81. Thus, the width of the wider part 96 is less likely to affect the signals transmitted through the first wire 91A.

The plurality of wires 85 include the first wire 91B. The FPC 37 has the via 73. The via 73 connects the pad 81B of the two pads 81 and the wider part 96 of the first wire 91B. That is, the wider part 96 supports a so-called pad-on-via. As a result, according to the HDD 10 of the present embodiment the FPC 37 can be improved in the design flexibility of the wires 85.

The width W2 of the wider part 96 is the same as or wider than the width of one pad 81. As a result, the wider part 96 can stably support the pad 81. Thus, the HDD 10 of the present embodiment can implement stable thickness adjustment of the FPC 37.

The plurality of wires 85 include at least one pair of second wires 92. The pair of second wires 92 extend in parallel, overlapping one of the pads 81. As a result, the second wires 92 can stably support the pad 81. As such, the HDD 10 of the present embodiment can implement stable thickness adjustment of the FPC 37.

Of the pair of second wires 92, the part overlapping one of the pads 81 with the base layer 70 interposed therebetween has a larger width than the part disposed apart from the other pads 81 along the second face 70*b*. As a result, the second wires 92 can stably support the pad 81. In this manner, the HDD 10 of the present embodiment can implement stable thickness adjustment of the FPC 37.

Each of the second wires 92 has the first edge 97, the second edge 98, and the extended part 99. The first edge 97 of one of the second wires 92 faces the other second wire 92. The second edge 98 is opposite the first edge 97. The extended part 99 protrudes from the second edge 98 and overlaps one of the pads 81 with the base layer 70 interposed therebetween. As such, the HDD 10 according to the present embodiment can restrict the pair of the extended parts 99 from excessively approaching each other. This results in preventing or reducing the occurrence of a short-circuit of the second wires 92 or a change in the interval between the second wires 92, which would otherwise affect the signals transmitted through the second wires 92.

The preamplifier 65 is electrically connected to the magnetic head 48 to output a write signal to the magnetic head 48 and receive a read signal from the magnetic head 48. The write signal represents information to be written to the magnetic disk 12 by the magnetic head 48. The read signal represents information read from the magnetic disk 12 by the magnetic head 48. As the number of the magnetic disks 12 increases or the recording technique for the magnetic heads 48 develops, the pads 81 for mounting the preamplifiers 65 increase in number and density. In this regard, tilting of the preamplifier 65, if it occurs, may cause the solder S to spread, resulting in a short circuit. However, the HDD 10 according to the present embodiment can implement the thickness adjustment of the FPC 37 to prevent the preamplifier 65 from being inclined. In the HDD 10 according to the present embodiment, the short circuit due to the spread solder S is unlikely to occur without the inclination of the preamplifier 65.

The plurality of first wires 91 and the plurality of pairs of second wires 92 transmit electrical signals different from the write signal and the read signal. In the HDD 10 according to the present embodiment, the plurality of first wires 91 or the plurality of pairs of second wires 92 overlap the pads 81 so that it is less likely that a change in impedance characteristics occurs, which would otherwise have an influence on the read signal or the write signal.

The second conductive layer 72 has the ground plane 86. Each of the plurality of pads 81 overlaps one of the plurality of first wires 91, one of the plurality of pairs of second wires 92, or the ground plane 86 with the base layer 70 interposed therebetween. Thus, the FPC 37 has a substantially uniform thickness at the locations of the plurality of pads 81. Consequently, in the HDD 10 according to the present embodiment the preamplifier 65 becomes unlikely to be inclined.

The preamplifier 65 has the quadrangular bottom face 111 facing the FPC 37. The plurality of pads 81 include the four corner pads 121, 122, 123, and 124 closest to the four corners 111*a* of the bottom face 111. Differences between the distances between the preamplifier 65 and the four corner pads 121 to 124 and an average value of the distances are within a range of ±8% of the average value. Namely, substantially no inclination of the preamplifier 65 occurs. The HDD 10 according to the present embodiment includes the first wires 91 and the plurality of pairs of second wires 92 to be able to prevent the preamplifier 65 from being inclined.

Second Embodiment

Hereinafter, a second embodiment will be described with reference to FIG. 6. Note that a constituent element having the same function as a constituent element that has been already described will be denoted by the same reference sign as that of the above-described constituent element, and the additional description will be omitted in some cases in the following description of a plurality of embodiments. In addition, a plurality of constituent elements denoted by the same reference sign do not necessarily have all the functions and properties in common, and may have different functions and properties according to each embodiment.

Figure 6:
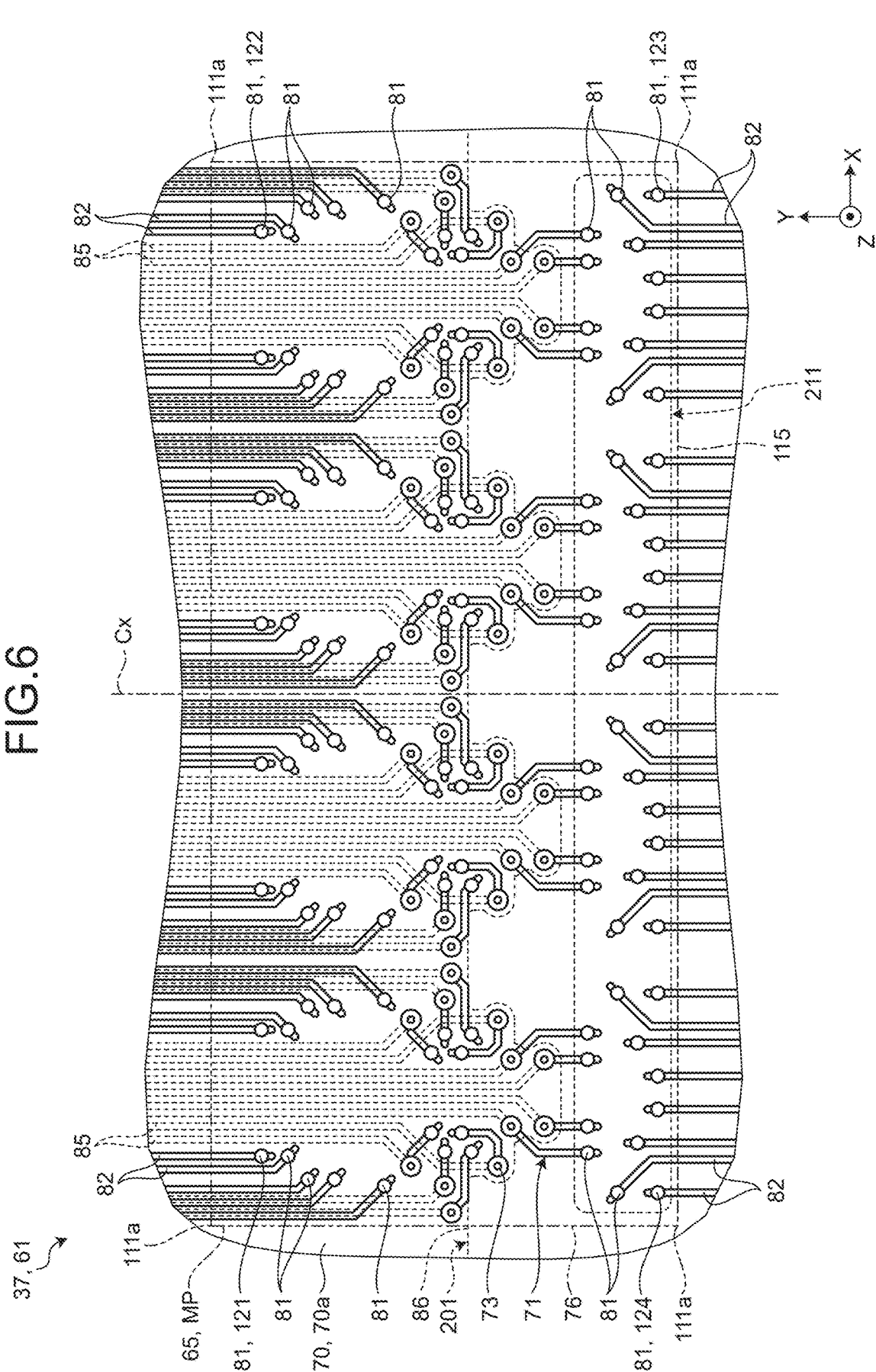
FIG. 6 is an exemplary plan view illustrating a mount of an FPC according to a second embodiment.

FIG. 6 is an exemplary plan view illustrating the mount MP of the FPC 37 according to the second embodiment. As illustrated in FIG. 6, the FPC 37 of the second embodiment includes a second conductive layer 201 instead of the second conductive layer 72. The second conductive layer 201 is substantially equal to the second conductive layer 72 except for the following points.

The entire second conductive layer 201 is disposed apart from the plurality of pads 81 along the second face 70*b*. For example, the plurality of wires 85 extend apart from the plurality of pads 81. The plurality of pads 81 include no pad-on-via. Further, the ground plane 86 is provided with an opening 211. The opening 211 is a hole or a cutout. On a projection plane orthogonal to the first face 70*a* illustrated in FIG. 6, at least one of the plurality of pads 81 is arranged inside the opening 211.

In the HDD 10 of the second embodiment described above, the second conductive layer 201 as a whole is disposed apart from the plurality of pads 81 along the second face 70*b*. As a result, the FPC 37 has a substantially uniform thickness at the locations of the plurality of pads 81. In this manner, the HDD 10 according to the present embodiment can make the preamplifier 65 be unlikely to be inclined. In the HDD 10 according to the present embodiment, the solder S is less likely to spread by not allowing the inclination of the preamplifier 65, to reduce or prevent the occurrence of a short circuit, for example. The FPC 37 can be thus improved in design flexibility.

Third Embodiment

Figure 7:
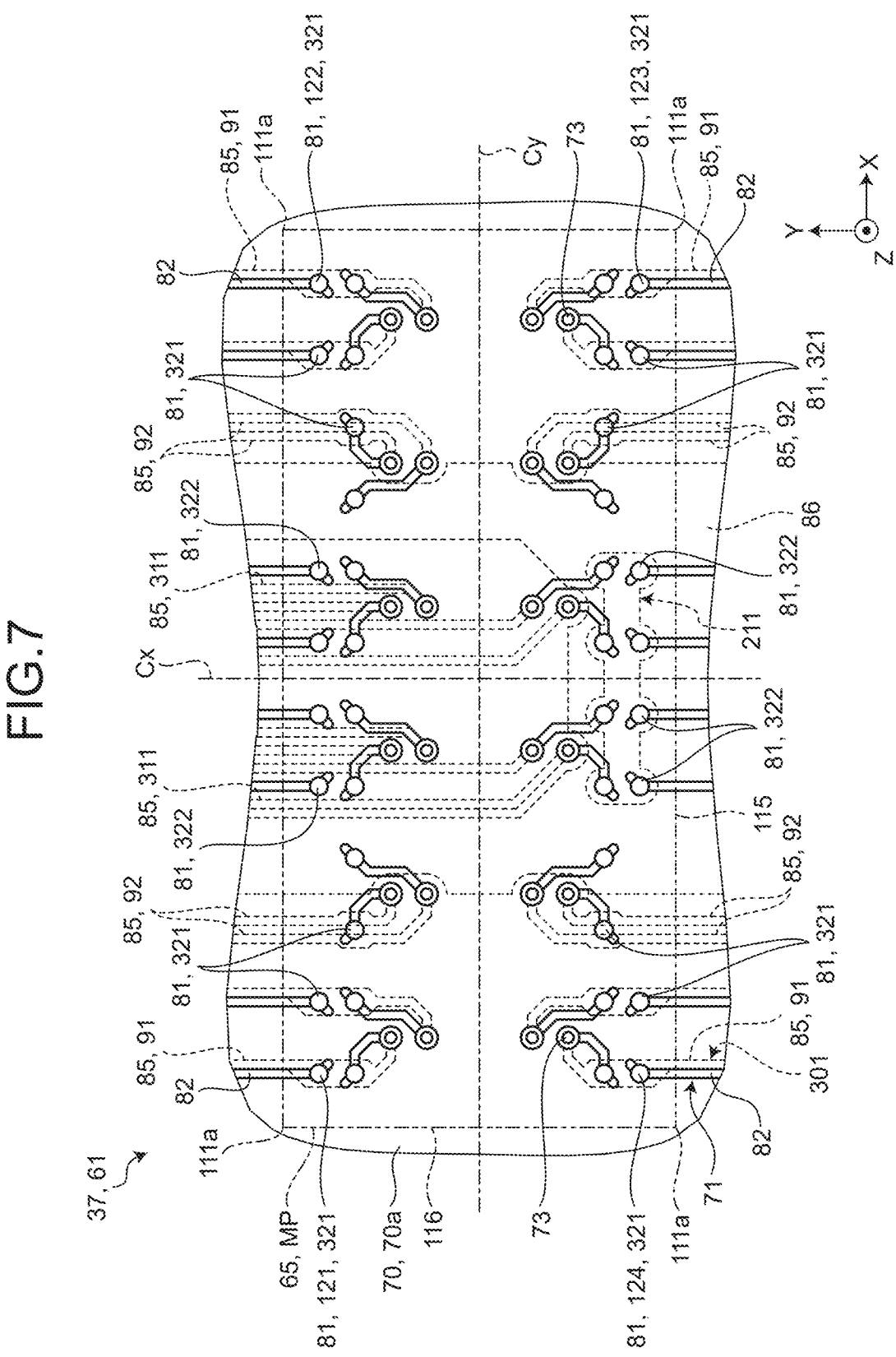
FIG. 7 is an exemplary plan view illustrating a mount of an FPC according to a third embodiment.

Hereinafter, a third embodiment will be described with reference to FIG. 7. FIG. 7 is an exemplary plan view illustrating the mount MP of the FPC 37 according to the third embodiment. As illustrated in FIG. 7, the FPC 37 of the third embodiment includes a second conductive layer 301 instead of the second conductive layer 72. The second conductive layer 301 is substantially equal to the second conductive layer 72 except for the following points.

The wires 85 of the second conductive layer 301 include a plurality of the first wires 91, the plurality of pairs of second wires 92, and a plurality of third wires 311. The plurality of third wires 311 are separated from the plurality of pads 81 along the second face 70*b*. Further, the ground plane 86 is provided with the opening 211.

The plurality of pads 81 include a plurality of first pads 321 and a plurality of second pads 322. Each of the plurality of first pads 321 overlaps the second conductive layer 301 with the base layer 70 interposed therebetween. For example, each of the plurality of first pads 321 overlaps one of the plurality of first wires 91, one pair of the plurality of pairs of second wires 92, or the ground plane 86. Each of the plurality of second pads 322 is separated from the second conductive layer 301 along the second face 70*b*.

The plurality of first pads 321 are arranged symmetrically with respect to the middle Cx. Further, the plurality of first pads 321 are arranged symmetrically with respect to a middle Cy of the preamplifier 65 in the Y direction. For example, each of the plurality of first pads 321 reversed with respect to the middle Cy at least partially overlaps the corresponding one of the first pads 321. The plurality of second pads 322 are arranged symmetrically with respect to the middle Cx. Further, the plurality of second pads 322 are arranged symmetrically with respect to the middle Cy.

In the HDD 10 of the third embodiment described above, the preamplifier 65 has the first lateral face 115 extending in the X direction along the first face 70*a* and the second lateral face 116 extending along the first face 70*a* and in the Y direction intersecting the X direction. Among the plurality of pads 81, the plurality of first pads 321 overlapping the second conductive layer 301 with the base layer 70 interposed therebetween are arranged symmetrically with respect to the middle Cx of the preamplifier 65 in the X direction. Among the plurality of pads 81, the plurality of second pads 322 arranged apart from the second conductive layer 301 along the second face 70*b* are also symmetric with respect to the middle Cx of the preamplifier 65 in the X direction. Due to such arrangement, during reflow the surface tension caused by the solder S can be distributed substantially symmetrically with respect to the middle Cx of the preamplifier 65 in the X direction. As such, in the HDD 10 according to the present embodiment the preamplifier 65 becomes unlikely to be inclined.

The plurality of first pads 321 are arranged symmetrically with respect to the middle Cy of the preamplifier 65 in the Y direction. The plurality of second pads 322 are also arranged symmetrically with respect to the middle Cy of the preamplifier 65 in the Y direction. As a result, during reflow, the surface tension caused by the solder S can be distributed substantially symmetrically with respect to the middle Cx of the preamplifier 65 in the X direction and with respect to the middle Cy of the preamplifier 65 in the Y direction. Thereby, in the HDD 10 according to the present embodiment the preamplifier 65 becomes unlikely to be inclined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:

a magnetic disk;

a magnetic head configured to read and write information from and to the magnetic disk;

a flexible printed circuit board electrically connected to the magnetic head, including an insulating layer, a first conductive layer disposed on a first face of the insulating layer, and a second conductive layer disposed on a second face of the insulating layer, the second face being opposite the first face; and a chip mounted on the flexible printed circuit board, wherein the first conductive layer includes a plurality of pads, the chip includes a plurality of terminals connected to the plurality of pads via solder, the second conductive layer includes a plurality of wires, the plurality of wires include at least either one or two or more first wires or one or two or more pairs of second wires, the one or two or more first wires each include a first part disposed apart from the plurality of pads along the second face, and a second part having a larger width than the first part, overlapping one of the plurality of pads with the insulating layer interposed in-between the second part and the one pad, and isolated from the one pad by the insulating layer, and the one or two or more pairs of second wires each overlap one of the plurality of pads, with the insulating layer interposed in-between the one pad and the second wire pair or pairs.

2. The disk device according to claim 1, wherein the plurality of wires include the one or two or more first wires, and the second part of at least one of the one or two or more first wires overlaps two adjacent pads among the plurality of pads, with the insulating layer interposed in-between the second part and the two adjacent pads.

3. The disk device according to claim 2, wherein the one or two or more first wires each further include a third part connected to the second part apart from the plurality of pads along the second face, the first part is connected to the second part, the second part extends between the first part and the third part, and the two adjacent pads are juxtaposed with an interval in a direction in which the second part extends.

4. The disk device according to claim 2, wherein the flexible printed circuit board includes a via that connects one of the two adjacent pads and the second part.

5. The disk device according to claim 1, wherein the plurality of wires include the one or two or more first wires, and the second part has a width equal to or larger than a width of the one pad.

6. The disk device according to claim 1, wherein the plurality of wires include the one or two or more pairs of second wires, and at least one pair of the one or two or more pairs of second wires extend in parallel, overlapping the one pad.

7. The disk device according to claim 1, wherein the plurality of wires include the one or two or more pairs of second wires, and of at least one pair of the one or two or more pairs of second wires, a part overlapping the one pad with the insulating layer interposed in-between the part and the one pad is larger in width than a part disposed apart from the plurality of pads along the second face.

8. The disk device according to claim 7, wherein of the one or two or more pairs of second wires, at least one pair of second wires each include a first edge facing the other second wire, a second edge opposite the first edge, and an extended part protruding from the second edge and overlapping the one pad with the insulating layer interposed in-between the extended part and the one pad.

9. The disk device according to claim 1, wherein the chip is electrically connected to the magnetic head, to output a write signal to the magnetic head and receive a read signal from the magnetic head, the write signal representing information to be written to the magnetic disk by the magnetic head, the read signal representing information read from the magnetic disk by the magnetic head.

10. The disk device according to claim 9, wherein the one first wire, the two or more first wires, the one pair of second wires, and the two or more pairs of second wires transmit an electrical signal different from the write signal and the read signal.

11. The disk device according to claim 1, wherein the second conductive layer has a ground plane, and each of the plurality of pads overlaps the one first wire, one of the two or more first wires, the one pair of second wires, one pair of the two or more pairs of second wires, or the ground plane, with the insulating layer interposed in-between each pad and the one first wire, the one of the plurality of first wires, the one pair of second wires, the one of the two or more of pairs of second wires, or the ground plane.

12. The disk device according to claim 1, wherein the chip has a quadrangular bottom face facing the flexible printed circuit board, the plurality of pads include four corner pads closest to four corners of the bottom face, and differences between distances between the four corner pads and the chip and an average value of the distances are within a range of ±8% of the average value.

13. The disk device according to claim 1, wherein the chip has a first lateral face extending in a first direction along the first face, and a second lateral face extending in a second direction along the first face, the second direction intersecting the first direction, the plurality of pads include a plurality of first pads overlapping the second conductive layer with the insulating layer interposed in-between the first pads and the second conductive layer, the plurality of first pads being arranged symmetrically with respect to a middle of the chip in the first direction, and the plurality of pads include a plurality of second pads arranged apart from the second conductive layer along the second face and symmetrically with respect to the middle of the chip in the first direction.

14. The disk device according to claim 13, wherein the plurality of first pads are arranged symmetrically with respect to the middle of the chip in the second direction, and the plurality of second pads are arranged symmetrically with respect to the middle of the chip in the second direction.

15. The disk device according to claim 1, wherein the chip is an amplifier.

16. A disk device comprising:

a magnetic disk;

a magnetic head configured to read and write information from and to the magnetic disk;

a flexible printed circuit board electrically connected to the magnetic head, including an insulating layer, a first conductive layer disposed on a first face of the insulating layer, and a second conductive layer disposed on a second face of the insulating layer, the second face being opposite the first face; and an electronic component mounted on the flexible printed circuit board, wherein the first conductive layer includes a plurality of pads, the electronic component includes a plurality of terminals connected to the plurality of pads via solder, the second conductive layer includes a plurality of wires, the plurality of wires include at least either one or two or more first wires or one or two or more pairs of second wires, the one or two or more first wires each include a first part disposed apart from the plurality of pads along the second face, and a second part having a larger width than the first part, overlapping one of the plurality of pads with the insulating layer interposed in-between the second part and the one pad, and isolated from the one pad by the insulating layer, and the one or two or more pairs of second wires each overlap one of the plurality of pads, with the insulating layer interposed in-between the one pad and the second wire pair or pairs.

\* \* \* \* \*